(12) United States Patent
Liu et al.

(10) Patent No.: US 9,281,243 B2
(45) Date of Patent: Mar. 8, 2016

(54) CHIP SCALE PACKAGE STRUCTURE AND MANUFACTURING METHOD THEREOF

(71) Applicant: XINTEC INC., Zhongli, Taoyuan County (TW)

(72) Inventors: Chien-Hung Liu, New Taipei (TW); Ying-Nan Wen, Hsinchu (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/172,832

(22) Filed: Feb. 4, 2014

(65) Prior Publication Data

US 2014/0225237 A1  Aug. 14, 2014

Related U.S. Application Data

(60) Provisional application No. 61/762,515, filed on Feb. 8, 2013.

(51) Int. Cl.
| | |
|---|---|
| *H01L 23/495* | (2006.01) |
| *H01L 21/78* | (2006.01) |
| *H01L 23/00* | (2006.01) |
| *H01L 23/552* | (2006.01) |
| *B81B 7/00* | (2006.01) |
| *H01L 21/56* | (2006.01) |
| *H01L 23/31* | (2006.01) |

(52) U.S. Cl.
CPC .............. *H01L 21/78* (2013.01); *B81B 7/0064* (2013.01); *H01L 21/561* (2013.01); *H01L 23/552* (2013.01); *H01L 24/11* (2013.01); *H01L 23/3114* (2013.01); *H01L 2924/12042* (2013.01); *H01L 2924/1461* (2013.01)

(58) Field of Classification Search
CPC ....... H01L 21/78; H01L 23/552; H01L 24/11; H01L 2924/1461; H01L 23/3114; H01L 23/60; H01L 2225/06537; H01L 21/561

USPC ........... 257/787, 788, 689, 667; 438/731, 11, 438/127, 109, 108

See application file for complete search history.

(56) References Cited

U.S. PATENT DOCUMENTS

| | | | | |
|---|---|---|---|---|
| 2002/0135727 | A1* | 9/2002 | Nakaminami | G02F 1/13452 349/149 |
| 2004/0121606 | A1* | 6/2004 | Raskin | H01L 23/645 438/694 |
| 2011/0186973 | A1* | 8/2011 | Pagaila | H01L 23/552 257/660 |
| 2011/0204494 | A1* | 8/2011 | Chi | H01L 21/56 257/659 |
| 2012/0273908 | A1* | 11/2012 | Kinsman | H01L 27/14618 257/432 |

\* cited by examiner

*Primary Examiner* — Jarrett Stark
*Assistant Examiner* — Shahed Ahmed
(74) *Attorney, Agent, or Firm* — Liu & Liu

(57) ABSTRACT

A chip scale package structure includes a chip, a dam unit, a board body, a plurality of first conductors, an encapsulating glue, a plurality of first conductive layers, an isolation layer, and a plurality of first electrodes. The dam unit is disposed on the surface of the chip. The board body is located on the dam unit. The first conductors are respectively in electrical contact with the conductive pads of the chip. The encapsulating glue covers the surface of the chip, and the board body and the first conductors are packaged in the encapsulating glue. The first conductive layers are located on the surface of the encapsulating glue opposite to the chip and respectively in electrical contact with the first conductors. The isolation layer is located on the encapsulating glue and the first conductive layers. The first electrodes are respectively in electrical contact with the first conductive layers.

17 Claims, 9 Drawing Sheets

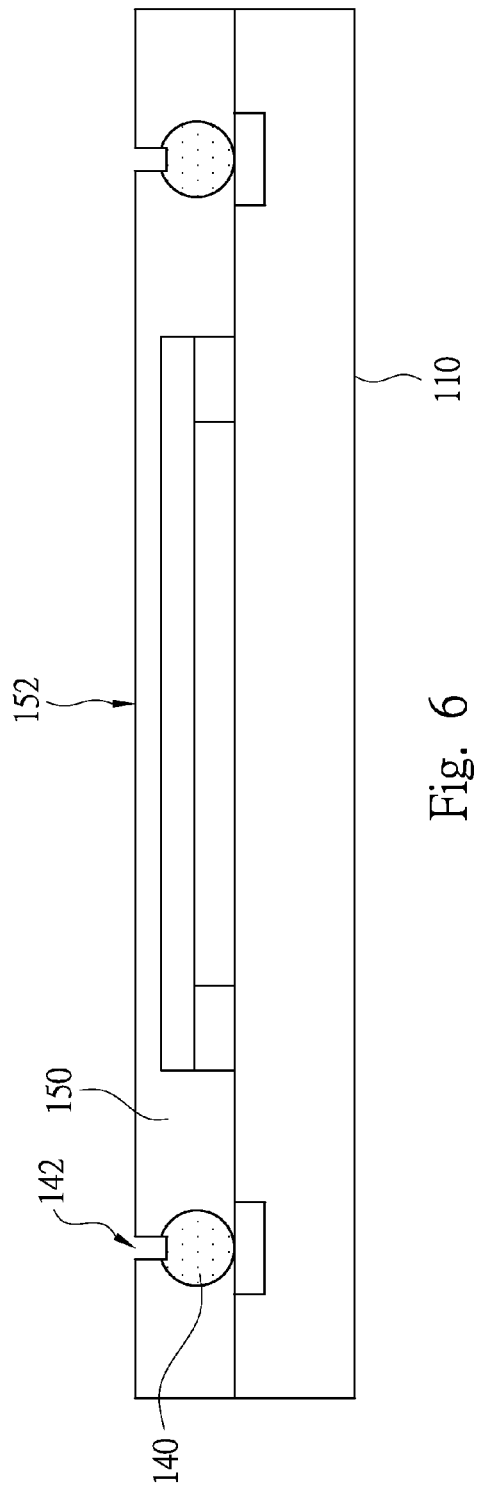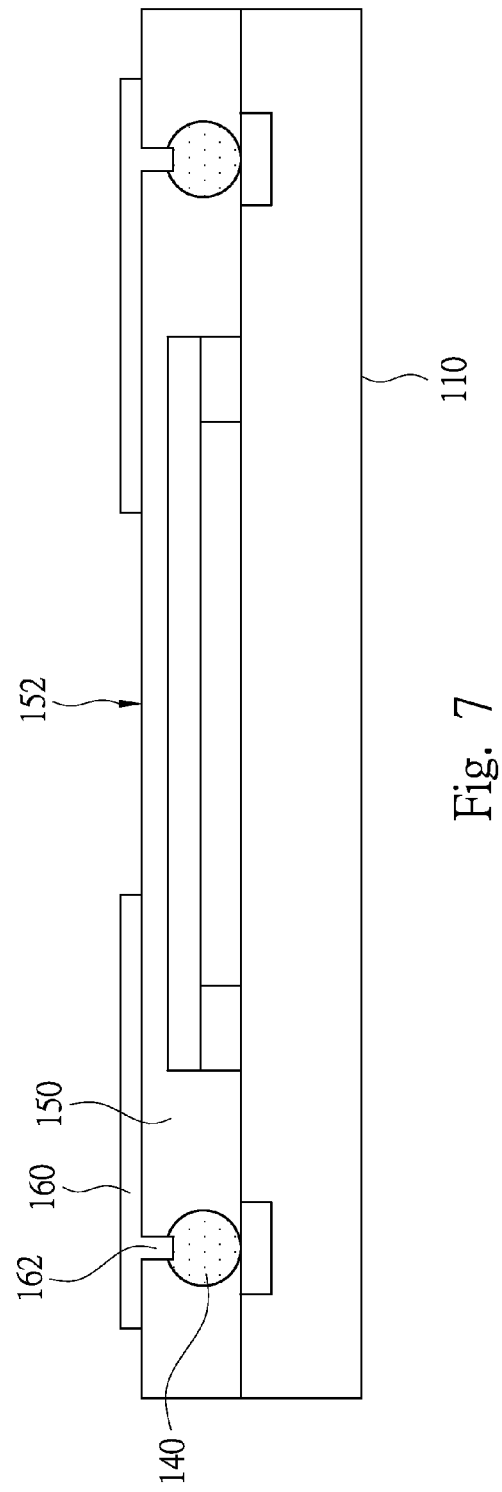

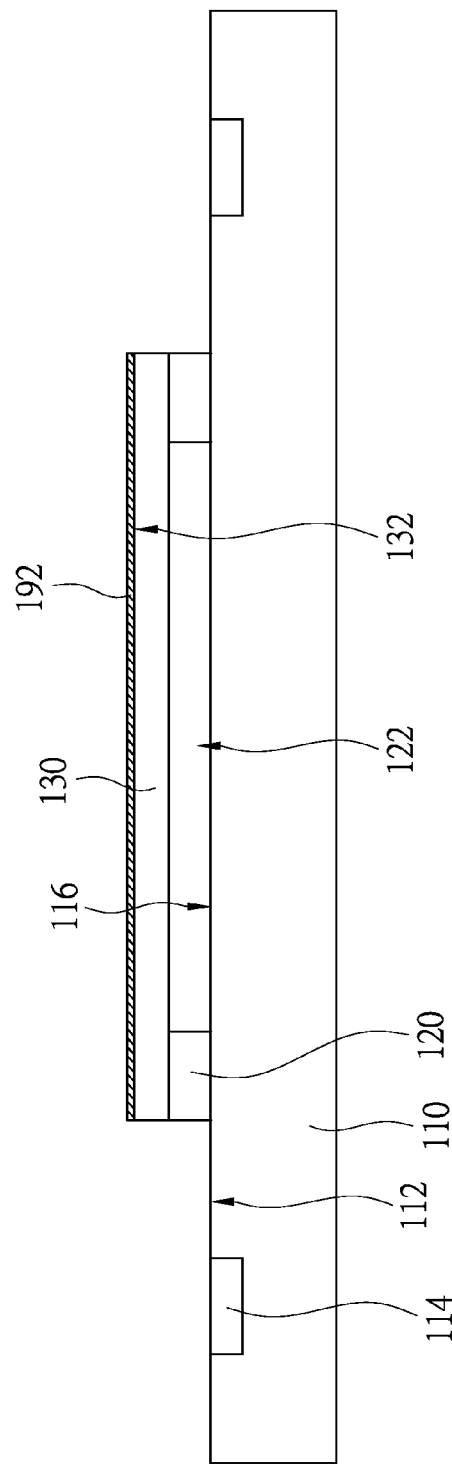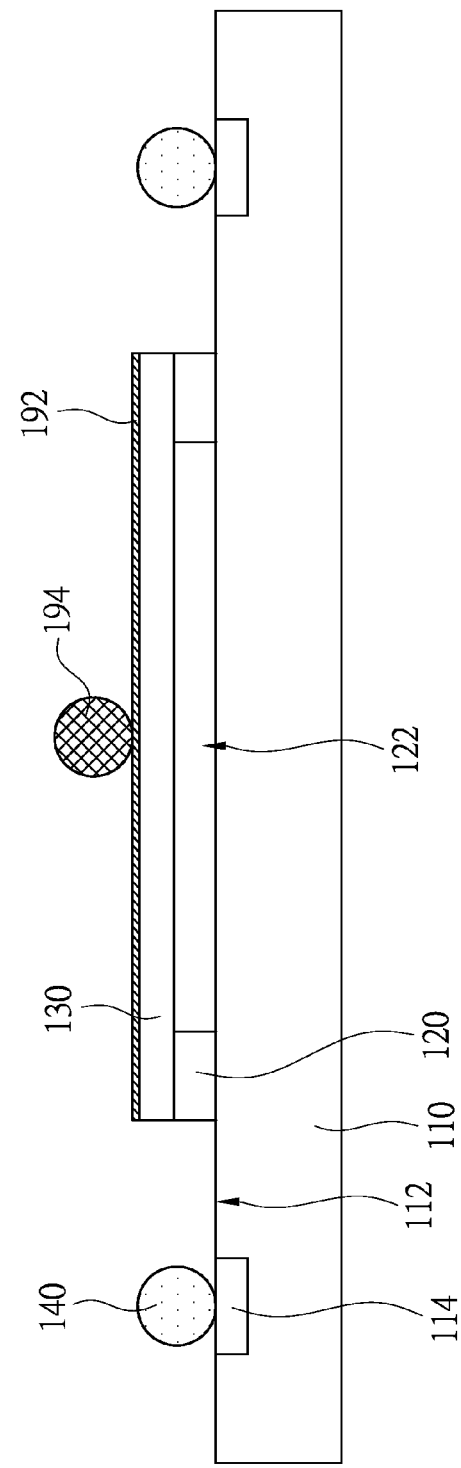

CHIP SCALE PACKAGE STRUCTURE AND MANUFACTURING METHOD THEREOF

RELATED APPLICATIONS

This application claims priority to U.S. provisional Application Ser. No. 61/762,515, filed Feb. 8, 2013, which is herein incorporated by reference.

BACKGROUND

1. Field of Invention

The present invention relates to a chip scale package structure and a manufacturing method of the chip scale package structure.

2. Description of Related Art

General chip scale package structures used in microelectromechanical systems (MEMS) are manufactured by quad flat no leads (QFN). Chips have pads and are electrically connected to external circuit contacts by wire-bonded to the pads. Thereafter, encapsulating glue is applied to cover the wire-bonded chips and external circuit contacts.

However, the thickness and the width of the chip scale package structure are limited by the available wiring area of the bonding wire, so as to difficultly reduce the thickness and the width, and thus the size of the chip scale package structure. Moreover, the chip scale package structure cannot directly be shipped out in wafer level package, and cannot be shipped out as a chip scale package without further manufacturing processes after being diced.

Furthermore, the chip scale package structure is absent from electromagnetic interference (EMI) preventing element, and is vulnerable to the disturbances of other electronic components.

SUMMARY

An aspect of the present invention is to provide a chip scale package structure.

According to an embodiment of the present invention, a chip scale package structure includes a chip, a dam unit, a board body, a plurality of first conductors, an encapsulating glue, a plurality of first conductive layers, an isolation layer, and a plurality of first electrodes. A surface of the chip has a plurality of conductive pads. The dam unit is disposed on the surface of the chip, and is located between the conductive pads. The dam unit surrounds an active area of the chip. The board body is located on the dam unit, and a space is formed among the board body, the dam unit, and the chip. The first conductors are respectively in electrical contact with the conductive pads. The encapsulating glue covers the surface of the chip, and the board body and the first conductors are packaged in the encapsulating glue. The first conductive layers are located on a surface of the encapsulating glue opposite to the chip, and are respectively in electrical contact with the first conductors. The isolation layer is located on the encapsulating glue and the first conductive layers. The first electrodes are respectively in electrical contact with the first conductive layers and protrude from the isolation layer.

In an embodiment of the present invention, each of the first conductive layers has an extending portion, and the extending portions are located in the encapsulating glue and respectively in electrical in contact with the first conductors.

In an embodiment of the present invention, the board body is a glass board or another chip.

In an embodiment of the present invention, the first conductors are made of a material that includes copper or gold.

In an embodiment of the present invention, the first conductive layers are made of a material that includes aluminum or copper.

In an embodiment of the present invention, the first electrodes are solder balls.

In an embodiment of the present invention, the encapsulating glue is made of a material that includes epoxy compound.

In an embodiment of the present invention, the chip scale package structure further includes a shielding layer, a second conductor, a second conductive layer, and a second electrode. The shielding layer is located on a surface of the board body opposite to the chip. The second conductor is in electrical contact with the shielding layer, and the second conductor and the shielding layer are packaged in the encapsulating glue. The second conductive layer is located on a surface of the encapsulating glue opposite to the chip and in electrical contact with the second conductor. The second electrode is in electrical contact with the second conductive layer and protrudes from the isolation layer.

In an embodiment of the present invention, the shielding layer is made of a material that includes aluminum or copper.

In an embodiment of the present invention, the second conductor is made of a material that includes copper or gold.

In an embodiment of the present invention, the second conductive layer is made of a material that includes aluminum or copper.

In an embodiment of the present invention, the second electrode is a solder ball.

Another aspect of the present invention is to provide a chip scale package structure manufacturing method.

According to an embodiment of the present invention, a chip scale package structure manufacturing method includes the following steps. A wafer and a board body are provided, and the board body is disposed on a surface of the wafer by a plurality of dam units. A plurality of first conductors are respectively fixed to a plurality of conductive pads of the wafer. An encapsulating glue is formed to cover the surface of the wafer, such that the board body and the first conductors are packaged in the encapsulating glue. A surface of the encapsulating glue opposite to the wafer is ground. A plurality of openings are formed on the encapsulating glue so as to expose the first conductors. A plurality of first conductive layers are formed on the grinding surface of the encapsulating glue, such that the first conductive layers are respectively in electrical contact with the first conductors. An isolation layer is formed on the encapsulating glue and the first conductive layers. A plurality of first electrodes are fixed in the isolation layer, such that the first electrodes are respectively in electrical contact with the first conductive layers and protrude from the isolation layer.

In an embodiment of the present invention, the chip scale package structure manufacturing method further includes: a shielding layer is formed on a surface of the board body opposite to the wafer.

In an embodiment of the present invention, the chip scale package structure manufacturing method further includes: a second conductor is fixed to the shielding layer, such that the second conductor is in electrical contact with the shielding layer.

In an embodiment of the present invention, the chip scale package structure manufacturing method further includes: a second conductive layer is formed on the grinding surface of the encapsulating glue, such that the second conductive layer is in electrical contact with the second conductor.

In an embodiment of the present invention, the chip scale package structure manufacturing method further includes: a second electrode is fixed in the isolation layer, such that the second electrode is in electrical contact with the second conductive layer and protrudes from the isolation layer.

In an embodiment of the present invention, the chip scale package structure manufacturing method further includes: the wafer is diced to form a plurality of chips.

In the aforementioned embodiments of the present invention, since the first conductor is in electrical contact with the conductive pad, the first conductive layer is in electrical contact with the first conductor, and the first electrode is in electrical contact with the first conductive layer, the first electrode can be electrically connected to the chip. The encapsulating glue of the chip scale package structure is not limited by the wiring area of the conventional bonding wire, so that the thickness and the width of the encapsulating glue may be reduced, and the size of the chip scale package structure may also be reduced. Moreover, the encapsulating glue covers the chip, and the isolation layer is located on the encapsulating glue and the first conductive layers. Therefore, the chip, the first conductor, and the first conductive layer are protected, and only the first electrode protrudes from the isolation layer. As a result, when the chip scale package structure is manufactured, the chip scale package structure does not need to be diced, and can be directly shipped with wafer level, or after the chip scale package structure is diced, plural chip scale package elements are formed for shipping.

In addition, the chip scale package structure may further include the shielding layer, the second conductor, the second conductive layer, and the second electrode. Since the second conductor is in electrical contact with the shielding layer, the second conductive layer is in electrical contact with the second conductor, and the second electrode is in electrical contact with the second conductive layer, the second electrode can be electrically connected to the shielding layer. As a result, the chip scale package structure has a ground function to prevent from electromagnetic interference (EMI).

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 6 is a cross-sectional view of the encapsulating glue shown in FIG. 5 after being ground;

FIG. 7 is a cross-sectional view of the first conductor shown in FIG. 6 when being in electrical contact with a first conductive layer;

FIG. 9 is a cross-sectional view of the board body shown in FIG. 8 when being disposed on the wafer;

FIG. 10 is a cross-sectional view of the first conductor when being disposed on the conductive pad shown in FIG. 9 and a second conductor when being disposed on a shielding layer shown in FIG. 9;

DETAILED DESCRIPTION

Figure 1:
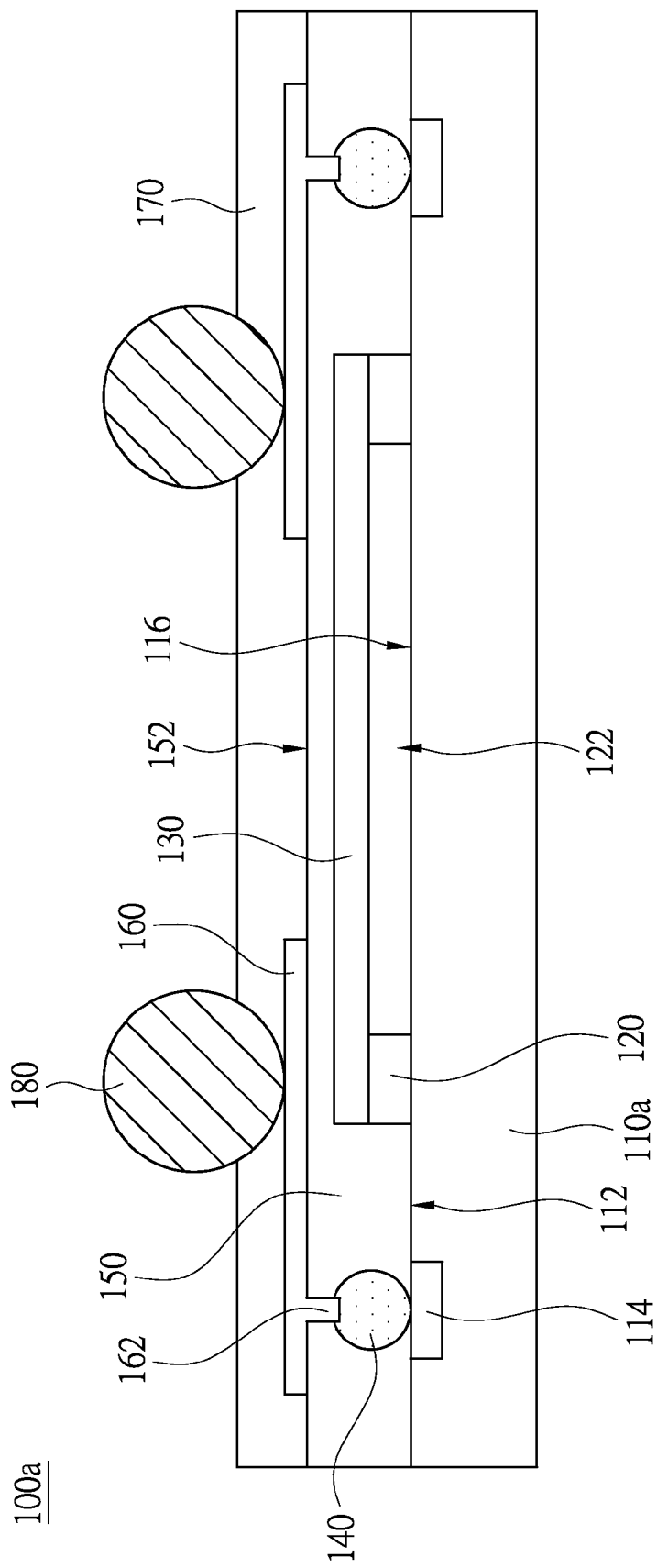
FIG. 1 is a cross-sectional view of a chip scale package structure according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a chip scale package structure 100a according to an embodiment of the present invention. The chip scale package structure 100a includes a chip 110a, a dam unit 120, a board body 130, a plurality of first conductors 140, an encapsulating glue 150, a plurality of first conductive layers 160, an isolation layer 170, and a plurality of first electrodes 180. A surface 112 of the chip 110a has a plurality of conductive pads 114. The dam unit 120 is disposed on the surface 112 of the chip 110a, and is located between the conductive pads 114. The dam unit 120 surrounds an active area 116 of the chip 110a. The active area 116 may be an image sensing component, a MEMS component, a calculating processor, etc, but the present invention is not limited in this regard. The board body 130 is located on the dam unit 120, and a space 122 is formed among the board body 130, the dam unit 120, and the chip 110a. The board body 130 may be another image sensing component, another MEMS component, another calculating processor, etc, but the present invention is not limited in this regard.

The first conductors 140 are respectively in electrical contact with the conductive pads 114. The encapsulating glue 150 covers the surface 112 of the chip 110a, and the board body 130 and the first conductors 140 are packaged in the encapsulating glue 150. Moreover, the first conductive layers 160 are located on a surface 152 of the encapsulating glue 150 opposite to the chip 110a, and each of the first conductive layers 160 has an extending portion 162. The extending portions 162 are located in the encapsulating glue 150 and may be used to be respectively in electrical contact with the first conductors 140. The isolation layer 170 is located on the encapsulating glue 150 and the first conductive layers 160. The first electrodes 180 are respectively in electrical contact with the first conductive layers 160 and protrude from the isolation layer 170.

In this embodiment, the chip 110a may be one of the chips formed from a wafer after a dicing process. The chip scale package structure 100a may be used in a MEMS electronic device, but the present invention is not limited in this regard. The board body 130 may be a glass board or another chip as deemed necessary by designers. The first conductors 140 may be made of a material that includes copper, gold, or other conductive materials. The first conductive layers 160 may be made of a material that includes aluminum, copper, or other conductive materials. The first electrodes 180 may be solder balls or other conductive materials. The encapsulating glue 150 may be made of a material that includes epoxy compound, and the isolation layer 170 may be a photoresist, but present invention is not limited in this regard.

Since the first conductor 140 is in electrical contact with the conductive pad 114, the first conductive layer 160 is in electrical contact with the first conductor 140, and the first electrode 180 is in electrical contact with the first conductive layer 160, the first electrode 180 can be electrically connected to the chip 110a. The encapsulating glue 150 of the chip scale package structure 100a is not limited by the wiring area of the conventional bonding wire, so that the thickness and the width of the encapsulating glue 150 may be reduced, and the size of the chip scale package structure 100a may also be reduced. Moreover, the encapsulating glue 150 covers the chip 110a, and the isolation layer 170 is located on the encapsulating glue 150 and the first conductive layers 160. Therefore, the chip 110a, the first conductor 140, and the first conductive layer 160 are protected, and only the first electrode 180 protrudes from the isolation layer 170. As a result, when the chip scale package structure 100a is manufactured, the chip scale package structure 100a does not need to be diced, and can be directly shipped with wafer level, or after the chip scale package structure 100a is diced, plural chip scale package elements are formed for shipping. Wafer level is referred to as plural chip scale package structures 100a connected with each other (i.e., a wafer not diced yet to form plural chips). The chip scale is referred to as a single chip scale package structure 100a.

Figure 2:
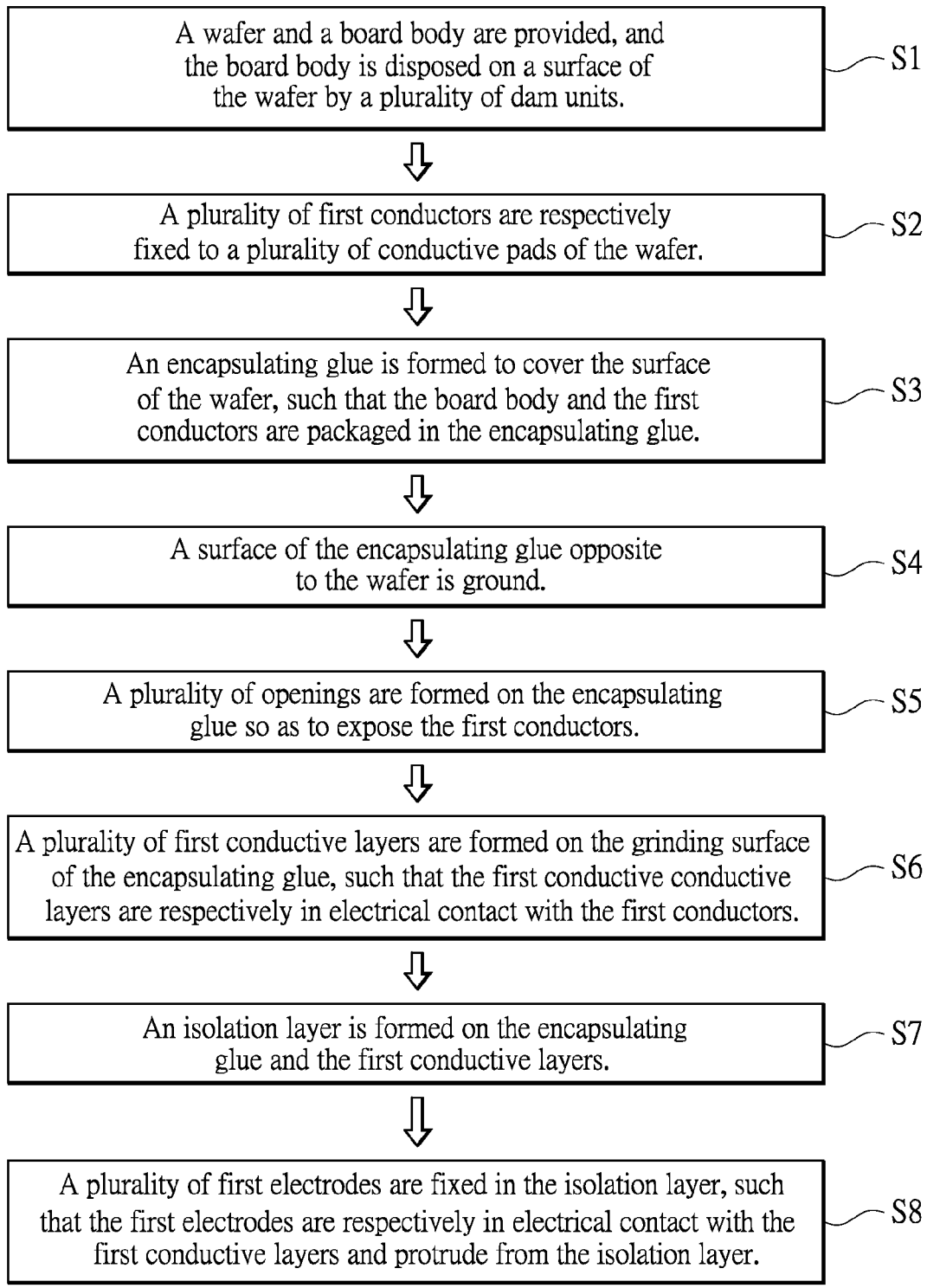
FIG. 2 is a flow chart of a chip scale package structure manufacturing method according to an embodiment of the present invention.

FIG. 2 is a flow chart of a chip scale package structure manufacturing method according to an embodiment of the present invention. In step S1, a wafer and a board body are provided, and the board body is disposed on a surface of the wafer by a plurality of dam units. Thereafter in step S2, a plurality of first conductors are respectively fixed to a plurality of conductive pads of the wafer. Next in step S3, an encapsulating glue is formed to cover the surface of the wafer, such that the board body and the first conductors are packaged in the encapsulating glue. Thereafter in step S4, a surface of the encapsulating glue opposite to the wafer is ground (referred to as the verb tense of "grind"). Next in step S5, a plurality of openings are formed on the encapsulating glue so as to expose the first conductors. Thereafter in step S6, a plurality of first conductive layers are formed on the grinding surface of the encapsulating glue, such that the first conductive layers are respectively in electrical contact with the first conductors. Next in step S7, an isolation layer is formed on the encapsulating glue and the first conductive layers. Finally in step 8, a plurality of first electrodes are fixed in the isolation layer, such that the first electrodes are respectively in electrical contact with the first conductive layers and protrude from the isolation layer.

In this embodiment, the chip scale package structure is manufactured by a wafer level packaging method. In the following description, each of the aforesaid steps will be described.

Figure 3:
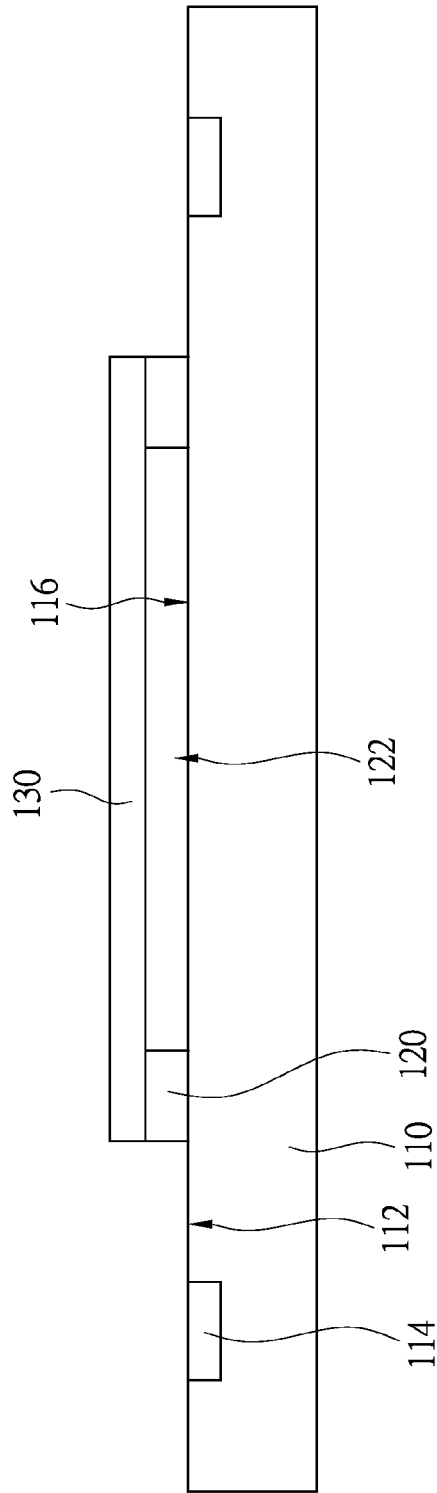
FIG. 3 is a cross-sectional view of a board body shown in FIG. 1 when being disposed on a wafer.

FIG. 3 is a cross-sectional view of the board body 130 shown in FIG. 1 when being disposed on a wafer 110. In order to simplify the drawings, the wafer 110 of all the drawings only shows a single chip unit. In practice, before the wafer 110 is diced, the wafer 110 is composed of plural chips 110a of FIG. 1. The board body 130 may be disposed on a surface 112 of the wafer 110 by plural dam units 120. The surface 112 of the wafer 110 has the conductive pads 114 at the external sides of the dam units 120. The dam unit 120 may be made of a material that includes epoxy resin, but the present invention is not limited in this regard.

Figure 4:
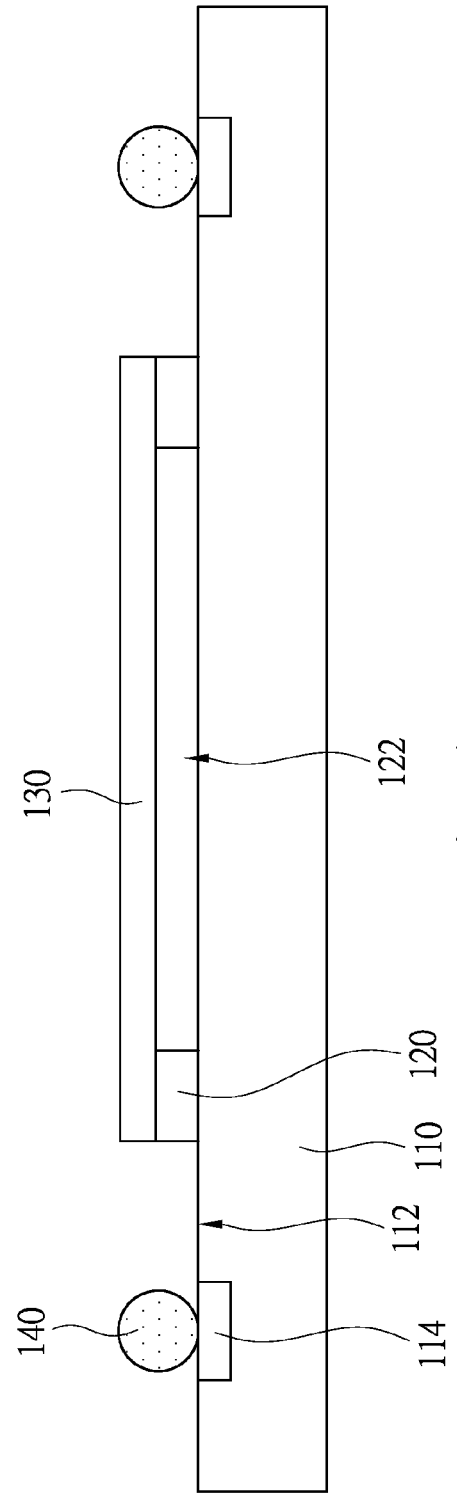
FIG. 4 is a cross-sectional view of a first conductor when being disposed on a conductive pad shown in FIG. 3.

FIG. 4 is a cross-sectional view of the first conductor 140 when being disposed on the conductive pad 114 shown in FIG. 3. As shown in FIG. 3 and FIG. 4, the first conductor 140 may be formed by a Cu pillar process, or the first conductor 140 may be fixed to the conductive pad 114 by a gold pump method as deemed necessary by designers.

Figure 5:
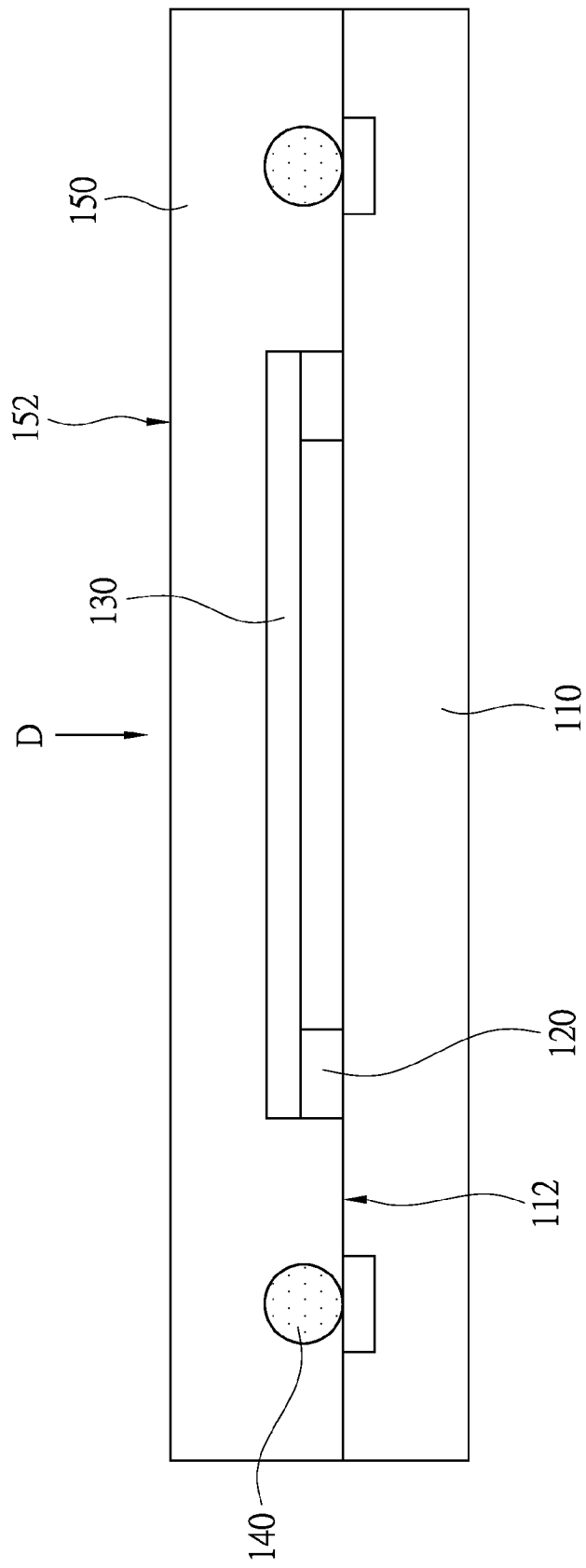
FIG. 5 is a cross-sectional view of the wafer shown in FIG. 4 when being covered by an encapsulating glue.

FIG. 5 is a cross-sectional view of the wafer 110 shown in FIG. 4 when being covered by the encapsulating glue 150. As shown in FIG. 4 and FIG. 5, after the first conductor 140 is fixed to the conductive pad 114, the encapsulating glue 150 may be formed on the surface 112 of the wafer 110 by coating, spraying, or molding, such that the board body 130 and the first conductor 140 are packaged in the encapsulating glue 150. Thereafter, the surface 152 of the encapsulating glue 150 opposite to the wafer 110 is ground (i.e., during a grinding process).

FIG. 6 is a cross-sectional view of the encapsulating glue 150 shown in FIG. 5 after being ground. As shown in FIG. 5 and FIG. 6, after the encapsulating glue 150 is ground, the thickness of the encapsulating glue 150 is reduced, such that the encapsulating glue 150 aligned with the first conductor 140 forms an opening 142. Or, the opening 142 is formed on the encapsulating glue 150 by laser drilling. As a result, the first conductor 140 may be exposed through the opening 142.

FIG. 7 is a cross-sectional view of the first conductor 140 shown in FIG. 6 when being in electrical contact with the first conductive layer 160. As shown in FIG. 6 and FIG. 7, the first conductive layer 160 may be formed on the surface 152 of the encapsulating glue 150 by sputtering, such that the extending portion 162 of the first conductive layer 160 can be in electrical contact with the first conductor 140. In this embodiment, photolithography process and etching process may be used to form the first conductive layer 160.

As shown in FIG. 1 and FIG. 7, when the chip 110a of FIG. 1 is not diced yet, plural chips 110a connected with each other may be referred to as the wafer 110 of FIG. 7. After the first conductive layer 160 is formed on the encapsulating glue 150, the isolation layer 170 may be formed on the encapsulating glue 150 and the first conductive layer 160 by a solder mask. The opening of the solder mask is aligned with the first conductive layer 160. Finally, the first electrode 180 may be fixed in the isolation layer 170 by solder bumping technology or printing, such that the first electrode 180 is in electrical contact with the first conductive layer 160. As a result, the structure (i.e., plural connected chip scale package structures 100a) can be directly shipped with wafer level. Furthermore, after the wafer 110 is diced, plural chips 110a are formed from the wafer 110, so that a single chip scale package structures 100a can be formed for shipping.

It is to be noted that the connection relationships and the materials of the elements described above will not be repeated in the following description, and only aspects related to other elements and manufacturing method of the chip scale package structures 100a will be described.

Figure 8:
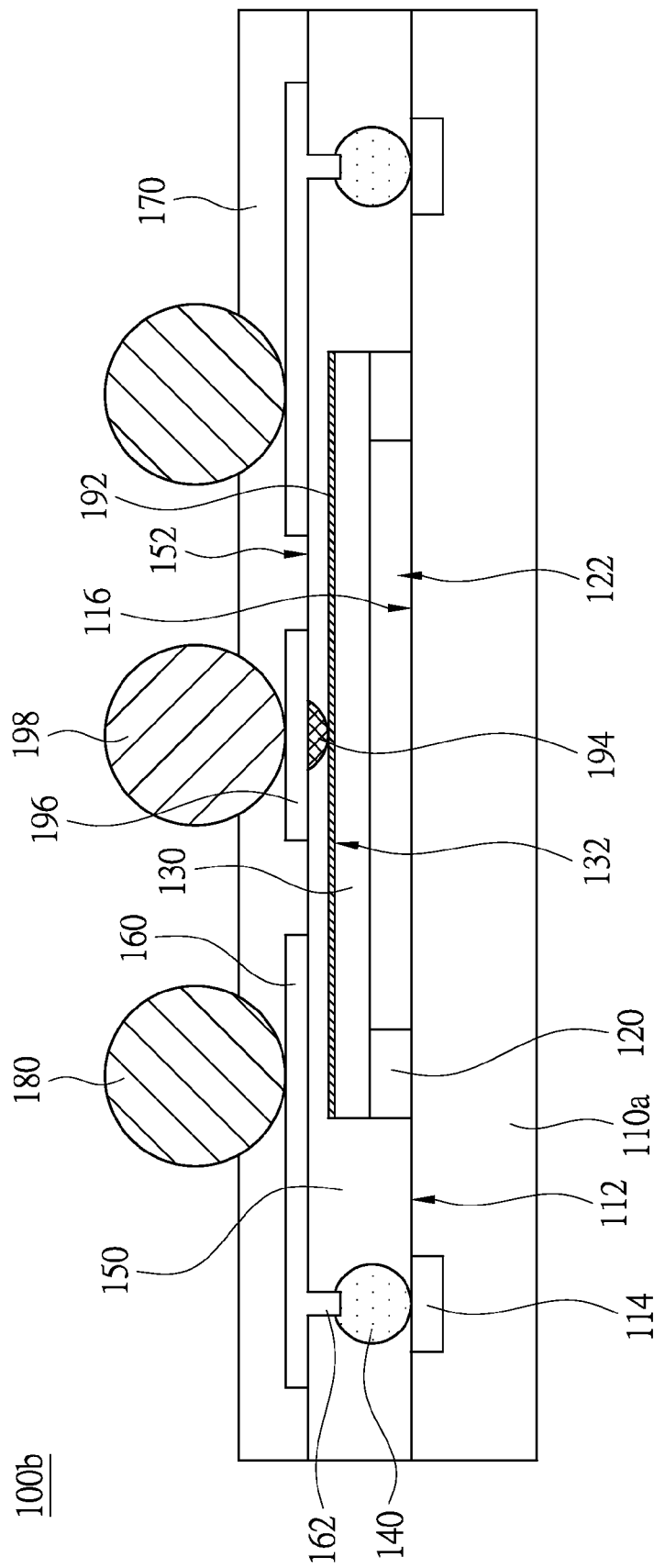
FIG. 8 is a cross-sectional view of a chip scale package structure according to an embodiment of the present invention.

FIG. 8 is a cross-sectional view of a chip scale package structure 100b according to an embodiment of the present invention. The chip scale package structure 100b includes a chip 110a, a dam unit 120, a board body 130, a plurality of first conductors 140, an encapsulating glue 150, a plurality of first conductive layers 160, an isolation layer 170, and a plurality of first electrodes 180. The difference between this embodiment and the embodiment shown in FIG. 1 is that the chip scale package structure 100b further includes a shielding layer 192, a second conductor 194, a second conductive layer 196, and a second electrode 198. The shielding layer 192 is located on a surface 132 of the board body 130 opposite to the chip 110a. The second conductor 194 is in electrical contact with the shielding layer 192, and the second conductor 194 and the shielding layer 192 are packaged in the encapsulating glue 150. The second conductive layer 196 is located on a surface 152 of the encapsulating glue 150 opposite to the chip 110a and in electrical contact with the second conductor 194. The second electrode 198 is in electrical contact with the second conductive layer 196 and protrudes from the isolation layer 170.

In this embodiment, the shielding layer 192 may be made of a material that includes aluminum, copper, or other conductive material. The second conductor 194 may be made of a material that includes copper, gold, or other conductive material, and the material of the second conductor 194 and the first conductor 140 may be the same. The second conductive layer 196 may be made of a material that includes aluminum, copper, or other conductive material, and the material of the second conductive layer 196 and the first conductive layer 160 may be the same. The second electrode 198 may be a solder ball or other conductive material, and the material of the second electrode 198 and the first electrode 180 may be the same.

Since the chip scale package structure 100b may further include the shielding layer 192, the second conductor 194, the second conductive layer 196, and the second electrode 198, and the second conductor 194 is in electrical contact with the shielding layer 192, the second conductive layer 196 is in electrical contact with the second conductor 194, and the second electrode 198 is in electrical contact with the second conductive layer 196, the second electrode 198 can be electrically connected to the shielding layer 192. As a result, the chip scale package structure 100b has a ground function to prevent from electromagnetic interference (EMI) generated by external electronic components.

FIG. 9 is a cross-sectional view of the board body 130 shown in FIG. 8 when being disposed on the wafer 110. The difference between this embodiment and the embodiment shown in FIG. 3 is that the shielding layer 192 is located on the surface 132 of the board body 130 opposite to the wafer 110.

FIG. 10 is a cross-sectional view of the first conductor 140 when being disposed on the conductive pad 140 shown in FIG. 9 and the second conductor 194 when being disposed on the shielding layer 192 shown in FIG. 9. The difference between this embodiment and the embodiment shown in FIG. 4 is that the second conductor 194 may be formed by a Cu pillar process, or the second conductor 194 may be fixed to the shielding layer 192 by a gold pump method, such that the second conductor 194 is in electrical contact with the shielding layer 192.

Figure 11:
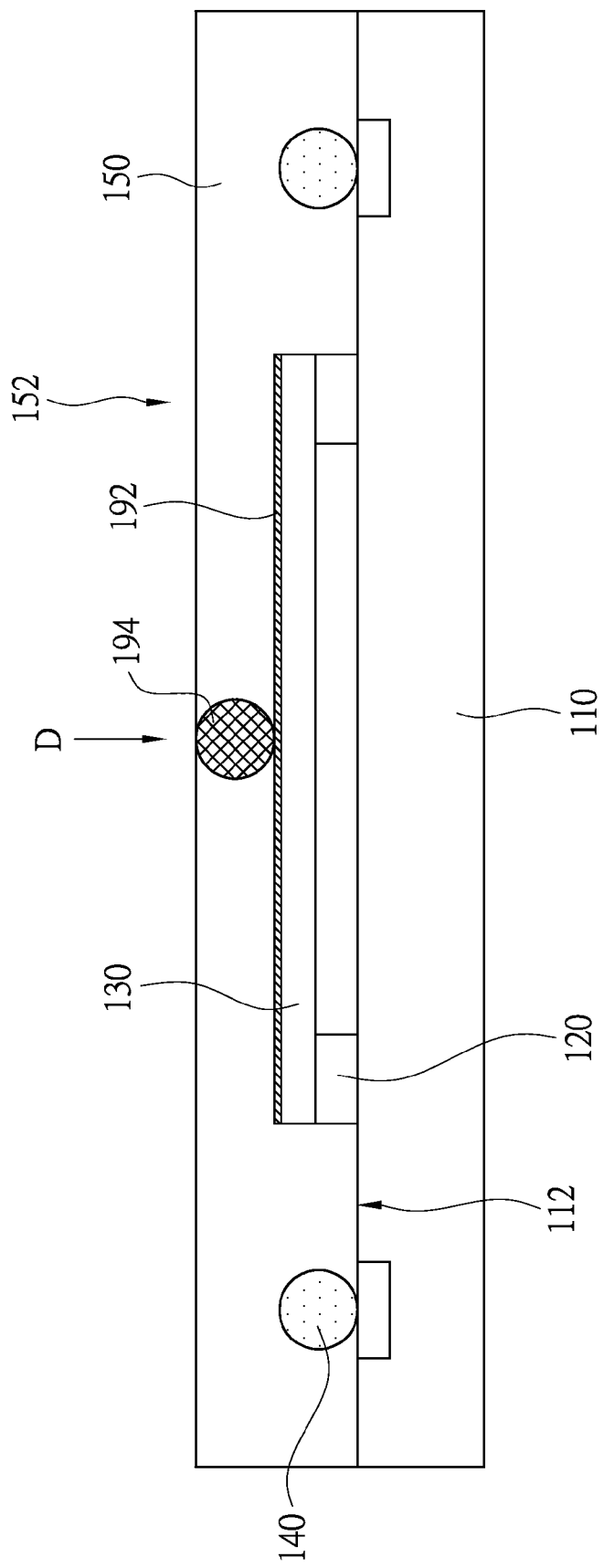
FIG. 11 is a cross-sectional view of the wafer shown in FIG. 10 when being covered by the encapsulating glue.

FIG. 11 is a cross-sectional view of the wafer 110 shown in FIG. 10 when being covered by the encapsulating glue 150. The difference between this embodiment and the embodiment shown in FIG. 5 is that not only the board body 130 and the first conductor 140 are packaged in the encapsulating glue 150, but also the second conductor 194 is packaged in the encapsulating glue 150.

Figure 12:
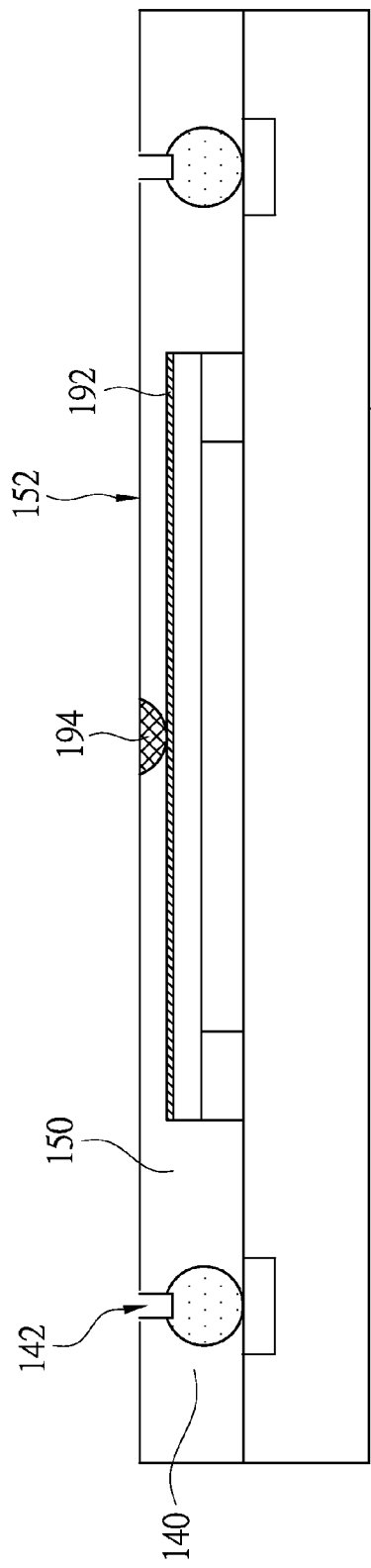
FIG. 12 is a cross-sectional view of the encapsulating glue shown in FIG. 11 after being ground.

FIG. 12 is a cross-sectional view of the encapsulating glue 150 shown in FIG. 11 after being ground. As shown in FIG. 11 and FIG. 12, after the encapsulating glue 150 is ground in a direction D, the thickness of the encapsulating glue 150 is reduced, such that the second conductor 194 is exposed from the encapsulating glue 150. Next, the opening 142 may be formed on the encapsulating glue 150 aligned with the first conductor 140 by laser drilling. As a result, the first conductor 140 is exposed through the opening 142.

Figure 13:
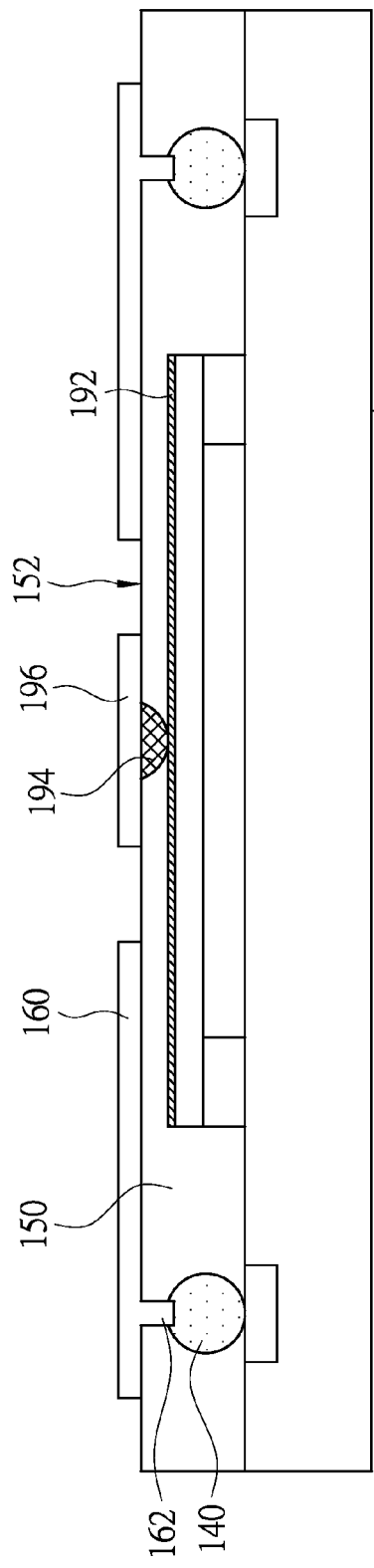
FIG. 13 is a cross-sectional view of the first conductor shown in FIG. 12 when being in electrical contact with the first conductive layer and the second conductor shown in FIG. 12 when being in electrical contact with a second conductive layer.

FIG. 13 is a cross-sectional view of the first conductor 140 shown in FIG. 12 when being in electrical contact with the first conductive layer 160 and the second conductor 194 shown in FIG. 12 when being in electrical contact with the second conductive layer 196. The difference between this embodiment and the embodiment shown in FIG. 7 is that the second conductive layer 196 may be formed on the grinding surface 152 of the encapsulating glue 150 by sputtering, such that the second conductive layer 196 is in electrical contact with the second conductor 194. In this embodiment, photolithography process and etching process may be used to form the second conductive layer 196.

As shown in FIG. 8 and FIG. 13, after the first conductive layer 160 and the second conductive layer 196 are formed on the encapsulating glue 150, the isolation layer 170 may be formed on the encapsulating glue 150, the first and second conductive layers 160, 196 by a solder mask. The openings of the solder mask are respectively aligned with the first and second conductive layers 160, 196. Finally, the first and second electrodes 180, 198 may be fixed in the isolation layer 170 by solder bumping technology or printing, such that the first electrode 180 is in electrical contact with the first conductive layer 160, and the second electrode 198 is in electrical contact with the second conductive layer 196.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A chip scale package structure comprising:
    a chip, wherein a surface of the chip has a plurality of conductive pads;
    a dam unit disposed on the surface of the chip and between the conductive pads, wherein the dam unit surrounds an active area of the chip;
    a board body located on the dam unit, wherein a space is formed among the board body, the dam unit, and the chip;
    a plurality of first conductors respectively in electrical contact with the conductive pads;
    an encapsulating glue covering the surface of the chip, wherein the board body and the first conductors are packaged in the encapsulating glue;
    a plurality of first conductive layers located on a surface of the encapsulating glue opposite to the chip and respectively in electrical contact with the first conductors, wherein each of the first conductive layers has an extending portion, and the extending portions are located in the encapsulating glue and respectively in electrical contact with the first conductors;
    an isolation layer located on the encapsulating glue and the first conductive layers; and
    a plurality of first electrodes respectively in electrical contact with the first conductive layers and protruding from the isolation layer.

2. The chip scale package structure of claim 1, wherein the board body is a glass board or another chip.

3. The chip scale package structure of claim 1, wherein the first conductors are made of a material that comprises copper or gold.

4. The chip scale package structure of claim 1, wherein the first conductive layers are made of a material that comprises aluminum or copper.

5. The chip scale package structure of claim 1, wherein the first electrodes are solder balls.

6. The chip scale package structure of claim 1, wherein the encapsulating glue is made of a material that comprises epoxy compound.

7. The chip scale package structure of claim 1, further comprising:
   a shielding layer located on a surface of the board body opposite to the chip;
   a second conductor electrically contacting the shielding layer, wherein the second conductor and the shielding layer are packaged in the encapsulating glue;
   a second conductive layer located on a surface of the encapsulating glue opposite to the chip and in electrical contact with the second conductor; and
   a second electrode electrically contacting the second conductive layer and protruding from the isolation layer.

8. The chip scale package structure of claim 7, wherein the shielding layer is made of a material that comprises aluminum or copper.

9. The chip scale package structure of claim 7, wherein the second conductor is made of a material that comprises copper or gold.

10. The chip scale package structure of claim 7, wherein the second conductive layer is made of a material that comprises aluminum or copper.

11. The chip scale package structure of claim 7, wherein the second electrode is a solder ball.

12. A chip scale package structure manufacturing method comprising:
   (a) providing a wafer and a board body, wherein the board body is disposed on a surface of the wafer by a plurality of dam units, each between a plurality of conductive pads and surrounding an active area of the wafer;
   (b) respectively fixing a plurality of first conductors to the plurality of conductive pads of the wafer;
   (c) forming an encapsulating glue to cover the surface of the wafer, such that the board body and the first conductors are packaged in the encapsulating glue;
   (d) grinding a surface of the encapsulating glue opposite to the wafer;
   (e) forming a plurality of openings on the encapsulating glue so as to expose the first conductors;
   (f) forming a plurality of first conductive layers on the grinding surface of the encapsulating glue, such that the first conductive layers are respectively in electrical contact with the first conductors, wherein each of the first conductive layers has an extending portion, and the extending portions are located in the encapsulating glue and respectively in electrical contact with the first conductors;
   (g) forming an isolation layer on the encapsulating glue and the first conductive layers; and
   (h) fixing a plurality of first electrodes in the isolation layer, such that the first electrodes are respectively in electrical contact with the first conductive layers and protrude from the isolation layer.

13. The chip scale package structure manufacturing method of claim 12, further comprising:
   forming a shielding layer on a surface of the board body opposite to the wafer.

14. The chip scale package structure manufacturing method of claim 13, further comprising:
   fixing a second conductor to the shielding layer, such that the second conductor is in electrical contact with the shielding layer.

15. The chip scale package structure manufacturing method of claim 14, further comprising:
   forming a second conductive layer on the grinding surface of the encapsulating glue, such that the second conductive layer is in electrical contact with the second conductor.

16. The chip scale package structure manufacturing method of claim 15, further comprising:
   fixing a second electrode in the isolation layer, such that the second electrode is in electrical contact with the second conductive layer and protrudes from the isolation layer.

17. The chip scale package structure manufacturing method of claim 12, further comprising:
   dicing the wafer to form a plurality of chips.

\* \* \* \* \*